(12) United States Patent
Konrad et al.

(10) Patent No.: US 6,197,472 B1
(45) Date of Patent: Mar. 6, 2001

(54) RECORDING MATERIAL HAVING A PIGMENT-COLORED RADIATION-SENSITIVE LAYER

(75) Inventors: Klaus-Peter Konrad, Gensingen; Andreas Elsaesser, Idstein; Frank Fischer, Mainz, all of (DE); John Kynaston Davies, Leeds (GB)

(73) Assignee: Afga-Gevaert N.V., Mortsel (BE)

( * ) Notice: Subject to any disclaimer, the term of this patent is extended or adjusted under 35 U.S.C. 154(b) by 0 days.

(21) Appl. No.: 09/532,324

(22) Filed: Mar. 21, 2000

(30) Foreign Application Priority Data

Apr. 8, 1999 (DE) ................................ 199 15 717

(51) Int. Cl.$^7$ .............................................................
(52) U.S. Cl. ............................................... 430/157
(58) Field of Search .................... 430/157, 158, 430/160, 161, 281.1, 288.1

(56) References Cited

U.S. PATENT DOCUMENTS

| 4,631,245 | 12/1986 | Pawlowski | 430/175 |
| 4,687,726 | 8/1987 | Schlögl et al. | 430/175 |
| 5,753,403 | * 5/1998 | Vermeersch et al. | 430/159 |

FOREIGN PATENT DOCUMENTS

| 34 17 645 | 11/1985 | (DE) . |
| 0 738 931 | 10/1996 | (EP) . |
| 0 778 497 | 6/1997 | (EP) . |

\* cited by examiner

Primary Examiner—John S. Chu
(74) Attorney, Agent, or Firm—Foley & Lardner

(57) ABSTRACT

The present invention relates to a recording material having a substrate and a negative-working, radiation-sensitive layer which contains a diazonium salt, metal-free colored pigments dispersed in an organic polymeric binder, transparent spacer pigments having a pore volume of more than 1.0 ml/g and a polymeric binder. The predispersal of the colored pigments is achieved by milling with an organic polymeric binder containing hydroxyl groups, some or all of which have been reacted with a di- or polycarboxylic anhydride so that the binder has an acid number of from 20 to 200. Printing plates in which the printing parts have a clearly visible contrast relative to the substrate can be produced from the recording material.

29 Claims, No Drawings

RECORDING MATERIAL HAVING A PIGMENT-COLORED RADIATION-SENSITIVE LAYER

BACKGROUND OF THE INVENTION

1. Field of the Invention

The present application relates to a recording material having a substrate and a negative-working, radiation-sensitive layer which includes a diazonium salt, metal-free organic colored pigments and a polymeric binder.

2. Description of the Related Art

Recording materials for offset printing plates are known. European Patent Publication No. 152 819-A (corresponding to U.S. Pat. No. 4,631,245) describes a negative-working recording material for the production of offset printing plates where the photosensitive layer contains a diazonium salt polycondensate, a carboxyl-containing polymeric binder and, optionally, a dye and/or colored pigments. For example, a paste, obtainable from Clariant Deutschland GmbH, under the name ®Renolblau B2G-HW, which is a blue copper phthalocyanine pigment (®Hostapermblau B2G) in a modified polyvinyl butyral (®Mowital B30H) is used for coloring the layer. However, the pigments pretreated in this manner dissolve slowly and to a limited extent in the coating solution. This limits the pigment content and hence the subsequently achievable image contrast. By increasing the stirring time in the mixing vessel, it is possible to achieve better mixing, but by increasing the stirring time, undesired sludge formation occurs. Copper-containing pigments also leave an undesired accumulation of copper in the aqueous baths where the recording materials are developed after imagewise exposure. Moreover, copper phthalocyanine pigments, as well as polyvinyl butyrals, only dissolve to a limited extent in aqueous alkaline developers, so that precipitates of layer components frequently form when the developer is highly contaminated. The precipitates in turn may impair the function of the developing machines as well as that of the developed plates by the formation of redeposits.

European Patent Publication No. 778 497-A relates to a negative-working recording material suitable for the production of offset printing plates. The unexposed parts of the radiation-sensitive layer of the recording material can be removed using neutral or alkaline aqueous solutions. The radiation-sensitive layer contains predispersed pigments, such as predispersed copper phthalocyanine pigments, a diazonium compound or a combination of a photopolymerizable compound and a photoinitiator. The radiation-sensitive layer also contains a polymeric binder which is soluble, or at least swellable, in aqueous alkaline solutions. The binder is prepared by reacting a hydroxyl-containing polymer with an anhydride, such as maleic anhydride or succinic anhydride, in the presence of a catalytically active amount of a tertiary amine. Anhydride-modified polyvinyl acetals are disclosed as suitable binders. The acid number of the binder is in general from 5 to 80. The binder also serves to disperse the colored pigments. In the pigment dispersion, the amount of the binder is from 2 to 20% by weight. In addition, the pigment dispersion includes from 60 to 96% by weight of an aliphatic ($C_1$–$C_8$)-alcohol, a ($C_1$–$C_8$)-alkylene glycol mono- or di-($C_1$–$C_8$)-alkyl ether (in particular 1-methoxypropan-2-ol), or a cyclic ketone. As a result of the predispersing, the amount of the colored pigments in the layer can be increased, thereby increasing the image contrast in the developed recording material and making the image more visible. This also ensures that the layer is completely removed in the unexposed parts and that the detached layer components are not redeposited, which would lead to a background fog or scumming during subsequent printing. The predispersing of the pigment is usually carried out in a ball mill. If an organic solvent having a relatively low boiling point is used (such as 1-methoxypropan-2-ol, which has a boiling point of from 118 to 119° C. at atmospheric pressure), however, thorough cooling of the mill is absolutely essential.

Attempts have also been made to eliminate the deficiencies of the recording materials disclosed in the prior art. European Patent Publication No.738 931-A discloses coloring a negative-working layer with heavy metal-free, in particular copper-free, predispersed phthalocyanine pigments. The predispersal is achieved with a polyvinyl alcohol in water, in the presence of a cationic surfactant. Although stable dispersions can be produced in this way, they can only be used in aqueous media. The pigment dispersion according to this European Patent Publication is, accordingly, only used in an aqueous photosensitive composition which, in addition to a water-soluble diazo resin or diazonium salt, contains a polyvinyl alcohol as a binder. The high polyvinyl alcohol content in the layers frequently leads to problems with ink acceptance during printing. Furthermore, the layers are not sufficiently resistant to the fountain solutions used during printing, and thus only relatively short print runs can be achieved. Also, in photosensitive mixtures which contain water-insoluble diazo or diazonium components and/or water-insoluble polymeric binders, the pigment dispersion is virtually unusable.

SUMMARY OF THE INVENTION

It is therefore an object of the present invention to overcome the drawbacks of the prior art and to provide a negative-working recording material which is colored with a metal-free colored pigment dispersion and in which the image formed from the radiation-sensitive layer by imagewise exposure and subsequent development is intensely colored and is distinguished from the substrate by high contrast. In a first aspect of the invention, a nonaqueous negative-working photosensitive composition should be capable of being homogeneously colored with the colored pigment dispersion. It should be possible to use high-boiling (boiling point greater than 180° C. at atmospheric pressure) solvents as the liquid phase of the dispersion, so that solvent losses during milling of the pigments are minimized. In another aspect of the invention, the dispersion should be capable of being uniformly distributed in a short time in the nonaqueous photosensitive composition, even in relatively large amounts, to achieve an intense coloration. According to another aspect of the invention, the dispersion and the layer produced therewith are substantially free of surfactants and low molecular weight dispersants. In another aspect of the invention, after development the printing parts of the offset plate obtained from the recording material should be so clearly detectable that the plate can, if required, be corrected. The clear detectability is furthermore important to enable the plate to be satisfactorily scanned by a scanner during preparation for printing. In a further aspect of the invention, the dispersion does not impair the development process, in that even if the developer is already highly contaminated with layer components, the colored pigments should not be precipitated from the developer mixture and should not even form deposits in the developing machine or on the developed plates.

It is a further aspect of the invention to provide a recording material having an improved spacer system.

Consequently, the photographic negative and the plate are brought rapidly into contact during evacuation, and the nitrogen gas formed during exposure is more readily expelled, resulting in more uniform halftone reproduction during subsequent printing. In the case of recording materials of the type described to date, known spacer pigments cannot be added in an amount as is desirable for optimum surface roughness, since they may lead to coating defects during production. In yet another aspect of the invention, the colored pigments, which are predispersed in a polymeric, organic binder and combined with transparent pigments have a specified pore volume.

These and other objects are achieved by a recording material which includes a substrate, a negative-working radiation sensitive layer which includes a diazonium salt, at least one metal-free organic colored pigment and a polymeric binder, wherein the metal-free organic colored pigments is dispersed in an organic polymeric binder, and wherein the layer includes one or more transparent spacer pigments having a pore volume greater than 1.0 ml/g. In another aspect of the invention, the transparent spacer pigments have a pore volume greater than 1.5 ml/g. In yet another aspect of the invention, the organic, polymeric binder includes hydroxyl groups, some or all of which have been reacted with an intramolecular di- or polycarboxylic anhydride so that the binder has an acid number of from about 20 to about 200. In a further embodiment, the radiation-sensitive layer further includes a combination of a polymerizable monomer or oligomer and a photopolymerization initiator.

In yet another aspect of the invention, the polymeric binder containing hydroxyl groups is a polymer having vinyl alcohol units, such as a polyvinyl alcohol or a polyvinyl acetal having free hydroxyl groups. In another aspect of the invention, the polymeric binder has an acid number of from about 50 to about 150 and an average molecular weight $M_W$ of from about 10,000 to about 300,000, preferably from about 20,000 to about 200,000. In another aspect of the invention, the reaction of the hydroxyl groups of the polymeric binder with the aromatic di- or polycarboxylic anhydrides is carried out in the presence of an organic or inorganic base. The organic base may be triethylamine or sodium carbonate.

In still a further aspect of the invention, the colored pigments are milled together with an organic solvent or solvent mixture whose boiling point at atmospheric pressure is 180° C. or more, preferably from about 180° C. to about 280° C. In another aspect of the invention, the transparent spacer pigments include $SiO_2$, $Al_2O_3$ or mixtures thereof and may have a mean diameter of from about 1 to about 10 μm, preferably from about 2 to about 6 μm.

In yet another aspect of the invention, the substrate is a metallic substrate, such as aluminum or aluminum alloy which may be mechanically, chemically and/or electrochemically roughened and/or anodically oxidized and/or provided with a hydrophilic coating. Other objects, features and advantages of the invention will become apparent from the following detailed description of the preferred embodiments of the invention.

DETAILED DESCRIPTION OF PREFERRED EMBODIMENTS

In the following detailed description, the preferred embodiments are described in sufficient detail to enable those skilled in the art to practice the invention, and it is to be understood that other embodiments may be utilized, and that changes may be made without departing from the spirit and scope of the present invention.

The present invention relates to a recording material having a substrate and a negative-working, radiation-sensitive layer which includes a diazonium salt, at least one metal-free organic colored pigment and a polymeric binder. The radiation-sensitive layer also contains one or more transparent spacer pigments having a specified pore volume of more than 1.0 ml/g as determined by the known methods of $N_2/H_2O$ or Hg adsorption (cf. Anal. Chem. 28 (3), 332 (1956), J. Colloid Interface Sci. 78 (1980), 31, and Proc. Nat. Acad. Sci. 7(1921), 115). The transparent spacer pigments preferably have a pore volume of more than 1.5 ml/g. The dispersing of the metal-free organic colored pigments is preferably achieved by milling the pigments in an organic solvent which has a boiling point that is preferably about 180° C. or more at atmospheric pressure, with an organic polymeric binder. The polymeric binder preferably contains hydroxyl groups, some or all of which have been reacted with an intramolecular di- or polycarboxylic anhydride, so that the binder preferably has an acid number of from about 20 to about 200. In addition, the radiation-sensitive layer optionally may contain a combination of a polymerizable monomer or oligomer and a photopolymerization initiator.

The metal-free organic colored pigments are preferably phthalocyanine pigments, in particular phthalocyanine itself (available as ®Heliogenblau D7490; Color Index No. 74 100; Pigment Blue 16). The amount of the dispersed pigments may be from about 2 to about 20% by weight, preferably from about 4 to about 12% by weight, based on the total weight of the dispersion. The metal-free organic colored pigments are dispersed by an organic, polymeric binder.

Suitable binders are, in particular, polymers having vinyl alcohol units. Polyvinyl alcohols and polyvinyl acetals which still have free hydroxyl groups are particularly preferred. However, other polymers containing hydroxyl groups, such as, for example, epoxy resins or homo- or copolymers having hydroxyalkyl (meth)acrylate units, may also be used in the present invention. To make the binders suitable for the purposes of the present invention, the binders are rendered alkali-soluble by reaction with an intramolecular di-or polycarboxylic anhydride. Both aliphatic or cycloaliphatic, and aromatic or heteroaromatic intramolecular di- or polycarboxylic anhydrides, are suitable. Among the (cyclo)aliphatic di- or polycarboxylic anhydrides, maleic anhydride, dimethylmaleic anhydride, citraconic anhydride, succinic anhydride, glutaric anhydride, cyclohexene-1,2-dicarboxylic anhydride or camphoric anhydride are preferred. Particularly preferred aromatic anhydrides include phthalic anhydride or trimellitic anhydride. However, naphthalene-2,3-dicarboxylic anhydride or naphthalene-1,8-dicarboxylic anhydride and heteroaromatic acid anhydrides, such as furan-2,5-dicarboxylic acid or thiophene-2,5-dicarboxylic anhydride, are also suitable.

Reaction products with aromatic carboxylic anhydrides lead to printing plates which have better stability, so that a longer print run may be achieved. For this reason, aromatic and heteroaromatic carboxylic anhydrides are preferred over aliphatic or cycloaliphatic ones. As a result of reaction with the carboxylic anhydride, the polymeric binder used for dispersing generally has an acid number of from about 20 to about 200, preferably from about 50 to about 150, most preferably from about 55 to about 120. The average molecular weight, $M_W$, of the polymeric binder may be in the range from about 10,000 to about 300,000, preferably from about 20,000 to about 200,000. Furthermore, it is preferable to carry out the reaction of the polymeric binder containing hydroxyl groups with the aromatic di- or polycarboxylic anhydrides in the presence of an organic or inorganic base, such as, for example, triethylamine or sodium carbonate. The amount of the polymeric binder used for dispersing may be from about 2 to about 30% by weight, preferably from about 5 to about 20% by weight, based on the total weight of the dispersion.

The predispersing of the colored pigments may be carried out in polar organic solvents. Examples of these solvents include ethylene glycol monomethyl ether, diethylene glycol monomethyl ether, N-methylpyrrolidone, ethylene glycol monobutyl ether acetate and y-butyrolactone. Mixtures of different solvents may also be used. The boiling point of the solvents at atmospheric pressure is preferably 180° C. or more, preferably from about 180 to about 280° C. The loss of solvent during mixing is thus reduced, and special cooling can be dispensed with. The pigment dispersion according to the invention is essentially free of water. Consequently, the organic solvents need not be water-miscible. The amount of the high-boiling polar organic solvent may be from about 50 to about 96% by weight, based on the total weight of the colored pigment dispersion.

The colored pigment dispersion is added to the negative-working mixture in an amount, such that the amount of pure colored pigments is from about 2 to about 20% by weight, preferably from about 3 to about 15% by weight, based on the total weight of the nonvolatile components of the negative-working radiation-sensitive layer.

A particular advantage of the recording material of the invention is that it performs without the necessary addition of surfactants. Surfactants are disadvantageous in the present invention as they generally impair the resistance of the layer during printing.

The colored pigment dispersion can be prepared using any conventional apparatus known to the person skilled in the art, such as a ball mill. A preferred method to practice the present invention is to first dissolve the binders for the dispersing in an organic solvent, add the metal-free pigments and then mill the mixture in a ball mill with the addition of glass beads or ceramic beads (diameter of the grinding beads preferably being about 1 mm). Optimum results are obtained when the milling process is repeated several times. During testing under a transmitted-light microscope, no particles having a diameter of more than 3 μm should be visible. The stability of the colored pigment dispersion is deemed to be sufficient if the radiation-sensitive mixture colored therewith can be stored for 3 days at room temperature without solid components settling out during this period.

In addition to the predispersed colored pigments, the radiation-sensitive mixture contains transparent pigments, such as, for example, pigments based on $SiO_2$ or $Al_2O_3$ or mixtures thereof. The transparent pigments generally have a mean diameter of from about 1 to about 10 μm and pore volumes preferably more than 1.0 ml/g, more preferably from about 1.5 to about 2.5 ml/g. The transparent pigments serve primarily as spacers during the contact exposure and prevent the formation of air bubbles between photographic negative and radiation-sensitive recording material. "Transparent" pigments are to be understood herein as meaning those pigments which are transparent to visible light. These pigments also may be predispersed, preferably with the same on similar binders and solvents as the colored pigments. The amount of the transparent pigments is in general from about 0.1 to about 10.0% by weight, preferably from about 0.5 to about 5.0% by weight, based on the total weight of the nonvolatile components of the radiation-sensitive layer.

The radiation-sensitive component in the negative-working radiation-sensitive layer is preferably a diazonium salt or a combination of a diazonium salt with a polymerizable monomer or oligomer and a photopolymerization initiator. Polymeric binders which may be used in the present invention are those which are generally customary in such mixtures as understood by those skilled in the art. In a particularly preferred embodiment, however, the binder in the radiation-sensitive mixture is identical to that for dispersing the pigments.

The photosensitive diazonium salt is preferably a condensate of an aromatic diazonium salt. Such condensates are disclosed, inter alia, in German Patent Publication No. 12 14 086-A and U.S. Pat. No. 3,325,384, the disclosure of which is herein incorporated by reference. They are prepared in general by condensation of a polynuclear aromatic diazonium compound, preferably a substituted or unsubstituted diphenylamine-4-diazonium salts, with active carbonyl compounds, most preferably formaldehyde, in a strongly acidic medium, preferably concentrated phosphoric acid.

U.S. Pat. Nos. 3,867,147 and 4,021,243 describe condensates which additionally contain units which are formed by condensation, are free of diazonium salt groups and are preferably derived from aromatic amines, phenols, phenol ethers, aromatic thioethers, aromatic hydrocarbons, aromatic heterocyclic compounds or organic acid amides. The disclosures of these patents are herein incorporated by reference.

The diazonium salt polycondensate preferably contains repeating units $R-N_2X$ which are linked to one another by intermediate members derived from condensable carbonyl compounds, preferably formaldehyde, wherein R is an aromatic radical including two or more benzene rings and X is an anion. The diazonium salt polycondensate may also include repeating units $A-N_2X$ and B, which are linked to one another by intermediate members, preferably methylene groups. The $A-N_2X$ and B repeating units are derived from condensible carbonyl compounds, A being the radical of an aromatic diazonium compound condensable with formaldehyde and B being the radical of a compound free of diazonium groups and condensable with formaldehyde, in particular of an aromatic amine, of a phenol, a phenol ether, an aromatic thioether, an aromatic hydrocarbon, an aromatic heterocyclic compound or an organic acid amide. Moreover, the diazonium salt polycondensates may also be a product having repeating units $A-N_2X$ and B, which are linked by divalent intermediate members derived from a condensable carbonyl compound. The diazonium salt units $A-N_2X$ are preferably derived from compounds of the formula:

$$(R^1-R^2-)_pR^3-N_2X$$

in which

X is an anion, p is an integer from 1 to 3, $R^1$ is an aromatic radical having at least one position capable of condensation with an active carbonyl compound, $R^2$ is a single bond or one of the following groups:
 $-(CH_2)_qNR^4-$,
 $-O-(CH_2)_r-NR^4-$,
 $-S-(CH_2)_rNR^4-$,
 $-S-CH_2-CO-NR^4-$,
 $-O-R^5-O-$,
 $-O-$, —S— or
—CO—NR$^4$—
in which
q is from 0 to 5,
r is from 2 to 5,
R$^4$ is hydrogen, a C$_1$–C$_5$ alkyl group, a C$_7$–C$_{12}$ aralkyl group or a C$_6$–C$_{12}$ aryl group and
R$^5$ is a C$_6$–C$_{12}$ arylene group, and
R$^3$ is an unsubstituted or substituted (p+1) valent benzene radical.

The (p+1) valent benzene radical is preferably substituted by (C$_1$–C$_4$)alkoxy or (C$_1$–C$_6$)alkyl groups. p is preferably 1, which means that R$^3$ is preferably an unsubstituted or substituted phenylene group.

The anion X may be chloride, sulfate, phosphate or an unsubstituted or substituted alkanesulfonate having 1 to 4 carbon atoms, such as, for example, methanesulfonate, or an aminoalkanesulfonate, as described in European Patent Publication No. 224 162. If the (C$_1$–C$_4$)alkanesulfonate is substituted, then it is preferably substituted by amino or alkoxy groups.

According to the present invention, condensates derived from unsubstituted or substituted diphenylamine-4-diazonium salts, preferably from 3-methoxydiphenyl-amine-4-diazonium salts, are preferred, and among these the readily obtainable condensates with formaldehyde. If the optionally present substituents are present, they are preferably (C$_1$–C$_4$)alkoxy or (C$_1$–C$_6$)alkyl groups. The condensation reaction can be carried out, in particular, in concentrated sulfuric, phosphoric or methanesulfonic acid. Preferably the condensation is carried out in phosphoric acid. In the preferred condensation case, the condensate can be used in the form of a crude condensate, i.e., the approximately 50% strength solution in phosphoric acid obtained in the condensation reaction can be used directly. This has the advantage that the phosphoric acid preferred for stabilizing the condensate in the mixture is already present. Sulfuric acid, methanesulfonic acid, para-toluene-sulfonic acid and citric acid are also suitable for stabilization. An excess of acid is frequently advantageous, and thus additional phosphoric acid may be added, in addition to that contained in the crude condensate.

The polymerizable monomer or oligomer, which is only optionally present, is generally an ethylenically unsaturated compound, preferably an ester or amide of acrylic, methacrylic, fumaric or maleic acid. Among these, the compounds having more than one polymerizable double bond are preferred. These include, for example, the esters of acids with alkanediols, poly- or oligoethylene glycols, poly- or oligopropylene glycols, poly- or oligobutylene glycols and other bifunctional low molecular weight or high molecular weight organic diols. The esters of polyhydric alcohols, such as, for example, glycerol, trimethylol-ethane or trimethylolpropane, pentaerythritol, isocyanuric acid, the ethoxylated or propoxylated derivatives thereof and dimers or oligomers of these compounds are particularly suitable. A high degree of esterification is advantageous. Amides, for example the compounds which are formally formed in the reaction of ethylenediamine or its oligomers with the acids described, may likewise be used. The amount of the polymerizable monomers and/or oligomers is preferably from about 5 to about 80% by weight, more preferably from about 10 to about 50% by weight, based on the total weight of the nonvolatile components of the radiation-sensitive layer.

Depending on the desired sensitization range, various materials are used as photopolymerization initiators which initiate the polymerization of the polymerizable monomer or oligomer under the action of actinic radiation, in particular visible or UV light. If the photosensitive material is to be sensitive to the near UV range (from 350 to 450 nm) customary in offset printing, the photoinitiator systems used differ from those used when exposure is to be effected in the visible spectral range, for example, laser radiation.

The photoinitiators exposed in the near UV range should absorb light in the range from about 250 to 500 nm with formation of free radicals. Examples include acyloins and derivatives thereof, such as benzoin, benzoin alkyl ether, vicinal diketones and derivatives thereof, e.g. benzil, benzil acetals, such as, for example, benzil dimethyl ketal, fluorenones, thioxanthones, polynuclear quinones, acridines and quinoxalines, and furthermore trichloromethyl-s-triazines, 2-halomethyl-4-vinyl-[1,3,4]oxadiazole derivatives, halooxazoles substituted by trichloromethyl groups, carbonyl methylene heterocycles containing trihalomethyl groups and acylphosphine oxide compounds. The photoinitiators may also be used in combination with one another or with coinitiators or activators, such as, for example with Michler's ketone or a derivative thereof or with a 2-alkylanthraquinone. In the case of the photoinitiators used in particular for exposure in the visible range, mixtures of metallocenes, photoreducible dyes, photolytically cleavable compounds having trihalomethyl groups and optionally further initiator and dye components, as described in European Patent Publication No. 364 735, are generally suitable. The metallocene component includes variously substituted cyclopentadienyl complexes of titanium or zirconium. Xanthene, benzoxanthene, benzothioxanthene, thiazine, pyronine, porphyrin or acridine dyes may also be used as photoreducible dyes. In the case of the trihalomethyl coinitiators, the known triazine derivatives with bromine or chlorine as halogen are particularly useful. In addition, the initiator may also contain, for example, acridine, phenazine or quinoxaline derivatives for increasing the sensitivity in the near UV range and may also contain, for example, dibenzylacetones or coumarins in the visible range.

The amount of photoinitiator, or of the initiator combination, is generally from about 0.1 to about 15% by weight, preferably from about 0.5 to about 10% by weight, based on the total weight of the nonvolatile components of the radiation-sensitive layer.

The photopolymerizable layer may additionally contain stabilizers for suppressing thermal polymerization, and plasticizers or other assistants for improving the mechanical or reprographic quality. It should still be ensured, however, that the added substances do not absorb an excessively large fraction of the actinic light required for the polymerization and thereby reduce the photosensitivity.

To render the mixture flowable so that it can be applied to a substrate material, an organic solvent may also be added. Suitable examples include, alcohols, ketones, esters or ethers. Partial ethers or ether-esters of ethylene glycols (in particular ethylene glycol and propylene glycol), dialkylene glycols or polyalkylene glycols are preferred. For example diethylene glycol mono(C$_1$–C$_6$)alkyl ethers, especially diethylene glycol monomethyl ether, diethylene glycol monoethyl ether or diethylene glycol monobutyl ether, may be added. In order to achieve good leveling of the layer and a uniform layer surface, the coating solvent preferably includes low-boiling as well as high-boiling organic solvents. The low-boiling organic solvents have a boiling point at atmospheric pressure less than 150° C., preferably from about 50 to about 120° C. Examples of suitable low-boiling organic solvents include tetrahydrofuran and ethylene glycol monomethyl ether. High-boiling organic solvents have a boiling point at atmospheric pressure greater than 180° C. Examples of suitable high boiling organic solvents include diethylene glycol mono ($C_1$–$C_6$)alkyl ethers. The high-boiling solvents are expediently identical to those solvents used in the dispersing of the colored pigments.

Suitable substrates include sheets, films or tapes formed of metal, plastic or plastic/ metal laminates. However, metallic substrates, in particular those of aluminum or of an aluminum alloy, are preferred. The aluminum substrates are usually mechanically, chemically and/or electrochemically roughened, if required. The substrate may also be anodically oxidized and/or provided with a coating having a hydrophilic effect, for example, a coating of polyvinylphosphonic acid. The radiation-sensitive mixture may be applied to the substrate by spin-coating or pouring on or by other generally customary and known methods. The coating is then dried, for example, in a forced-draft oven. The weight of the dried radiation-sensitive layer may be from about 0.3 to about 3.0 $g/m^2$, preferably from about 0.5 to about 2.0 $g/m^2$, most preferably from about 0.6 to about 1.6 $g/m^2$.

The radiation-sensitive recording material is then exposed imagewise. Depending on the type of photosensitive component, UV, visible or IR radiation may be used. In general, exposure is effected through the photographic negative. For this purpose, the negative is placed directly on the radiation-sensitive layer in a vacuum contact printing frame. Prior to exposure, the air remaining between the photographic negative and the recording material is pumped out.

After the imagewise exposure, the recording material is then developed with an aqueous alkaline solution suitable for negative recording materials. Such solutions are known and are described, for example, in German Patent Publication No. 197 55 295. A particularly suitable developer includes at least one compound which is alkaline in water, at least one emulsifier, at least one water-miscible organic solvent and at least one surfactant. The alkaline compound may be an alkanolamine, preferably ethanolamine, di- or triethanolamine, isopropanolamine, diisopropanolamine or trishydroxymethylaminomethane. The alkaline component may also be a hydroxide, preferably an alkali metal or alkaline earth metal hydroxide. The alkaline component may also be a phosphate or a carbonate, preferably sodium, potassium or ammonium carbonate or bicarbonate. The amount of the alkaline compound is generally from about 0.1 to about 20% by weight, preferably from about 0.5 to about 10% by weight, based on the total weight of the ready-to-use developer. The pH of the alkaline component is generally from about 8 to about 13%, preferably from about 8.5 to about 11.5.

An emulsifier may also be used in the present invention. The emulsifier is generally a copolymer having units of hydrophobic vinyl compounds and hydrophilic, ethylenically unsaturated carboxylic acids, a part of the carboxyl groups of the copolymer also being esterified. The amount of the emulsifiers is generally from about 0.1 to about 10% by weight, preferably from about 0.2 to about 8.0% by weight.

Organic solvents which are defined as "water-miscible" in the context of the present invention include those which, in the amount used (up to about 20% by weight) and at a temperature at which the developer is usually stored or used (from about 0 to 60° C.), form a uniform solution with water. Particularly suitable water-miscible organic solvents include alcohols, such as benzyl alcohol, ethylene glycol monophenyl ether, 1- or 2-phenylethanol, glycerol or glyceryl acetate. The amount of these used solvents used in the present invention is generally from about 0.5 to about 15.0% by weight, preferably from about 1.0 to about 10.0% by weight, most preferably from about 2.0 to about 6.0% by weight, based on the total weight of the ready-to-use developer.

Particularly suitable among the surfactants for use in the present invention are the anionic surfactants. In addition, mixtures of anionic with nonionic or zwitterionic surfactants may also be successfully used. In particular, anionic surfactants, such as alkali metal octylsulfates, alkali metal dodecylbenzenesulfonates, alkali metal alkylphenol ether sulfates, alkali metal naphthalenesulfonates, alkali metal sulfosuccinates and alkali metal alkyl ether phosphates, have shown use in the invention. Preferred nonionic surfactants for use in the present invention originate, for example, from the substance classes comprising ($C_{10}$–$C_{18}$) fatty alcohol ethoxylates, polyethylene glycols, ethylene oxide/propylene oxide (block) copolymers and alkylphenol ethoxylates. The amount of the surfactants present is generally from about 0.2 to about 12.0% by weight, preferably from about 0.5 to about 8.0% by weight, most preferably from about 1.0 to about 6.0% by weight, based on the total weight of the developer.

After development, the parts which subsequently accept the printing ink are distinguished from the substrate material by being clearly visible and having a high contrast. The difference in the optical density between the (bare) substrate and the layer parts, determined by reflection densitometry using a cyan filter, is, as a rule, at least 0.8. The color pigmentation neither impairs the development process nor reduces the print run. Owing to the high contrast, the printing plate thus obtained can, if required, be easily corrected. Even more important is the fact that the fraction of the printing parts of the plate can be reliably detected by a scanner. Printing plates which can readily achieve print runs of from 250,000 to 300,000 prints can be produced from the recording material according to the invention.

The following Examples serve to illustrate the invention. The Examples should not be construed to limit the present invention, but instead serve to illustrate preferred embodiments thereof. The abbreviation "pbw" represents "part(s) by weight". Percentage are percentages by weight, unless stated otherwise. Comparative experiments and comparative materials are indicated by an asterisk (*).

EXAMPLES

The diazonium salt used in the example was a diazonium salt poly-condensate prepared from equimolar amounts of 3-methoxydiphenylamine-4-diazonium sulfate and 4,4'-bismethoxymethyldiphenyl ether in 85% strength phosphoric acid, isolated as mesitylene sulfonate.

In addition, the following polymeric binders and dispersants were used:

P1: a polyvinyl butyral having an average molecular weight $M_w$ of about 37,000, which contained 71 mol % of vinyl butyral units, 27 mol % of vinyl alcohol units and 2 mol % of vinyl acetate units and had been reacted with benzene-1,2,4-tricarboxylic anhydride (trimellitic anhydride) in a mixture of γ-butyrolactone and butanone (mixing ratio 1 pbw:2 pbw) in the presence of triethylamine; the reaction product precipitated in water had an acid number of about 100 mg KOH/g.

P2: a polyvinyl butyral having an average molecular weight $M_w$ of about 80,000, which contained 71 mol % of vinyl butyral units, 27 mol % of vinyl alcohol units and 2 mol % of vinyl acetate units and had been reacted with phthalic anhydride in diethylene glycol monomethyl ether ("methyldiglycol") in the presence of anhydrous sodium carbonate; the reaction product precipitated in water had an acid number of about 70 mg KOH/g.

P3: a polyvinyl butyral having an average molecular weight $M_w$ of about 80,000, which contained 71 mol % of vinyl butyral units, 27 mol % of vinyl alcohol units and 2 mol % of vinyl acetate units and had been reacted with maleic anhydride in butanone in the presence of triethylamine; the reaction product precipitated in water had an acid number of about 40 mg KOH/g.

The colored pigment dispersions shown in Table 1 were first prepared with these polymeric binders in a stirred ball mill in the manner already described.

(MEK is methyl ethyl ketone=butanone; THF is tetrahydrofuran).

TABLE 1

| Disper-sion | Polymeric dispersant | | Heliogen-blau D 7490 | Solvent | |
|---|---|---|---|---|---|
| | Type | % by weight | % by weight | Type | % by weight |
| D1 | P1 | 13.05 | 8.0 | Methyl-diglycol | 78.95 |
| D2 | P2 | 10.20 | 6.2 | Methyl-diglycol | 83.20 |
| D3 | P3 | 8.00 | 4.0 | MEK/THF (1:1) | 88.00 |

The coating mixtures shown in Table 2 were then prepared using the colored pigment dispersions thus obtained. The mixtures were thoroughly stirred in each case for at least one hour.

TABLE 2

| | Examples (the stated amounts in parts by weight (pbw), unless stated otherwise) | | | | |
|---|---|---|---|---|---|
| Component | 1 | 2 | 3 | 4 | 5* |
| Diazo compound | 1.40 | 1.40 | 1.30 | 1.30 | 1.50 |
| Binder   P1 | 1.825 | 1.825 | — | — | — |
| P2 | — | — | 1.40 | 1.40 | — |
| P3 | — | — | — | — | 2.0 |
| Dispersion D1 | 7.5 | 7.5 | — | — | — |
| D2 | — | — | 5.70 | 5.70 | — |
| D3 | — | — | — | — | — |
| Renolblau CF-HW | — | — | — | — | 0.4 |
| Phenylazo-diphenylamine | 0.01 | 0.01 | 0.01 | 0.01 | 0.01 |
| Diethylene glycol monomethyl ether | 47.255 | 47.255 | 41.58 | 41.58 | 45.0 |
| Ethanol | 42.0 | 42.0 | 50.0 | 50.0 | 51.08 |
| Solid | 4.82% | 4.82% | 3.68% | 3.68% | 3.92% |
| Pigment content (pbw) in 100 pbw of solution | 0.60 | 0.60 | 0.3534 | 0.3534 | 0.20 |
| Total polymer (binder + dispersant) | 2.80 | 2.80 | 1.98 | 1.98 | 2.00 |
| Water-repellent silicic acid pigments[1)] | | | | | |
| MPV[2)]: 1.0 ml/g | — | 0.4 | — | 0.6 | — |
| MPV: 2.0 ml/g | 0.6 | — | 0.5 | — | — |
| Stirring time of the coating solution | 1 h | 1 h | 1 h | 1 h | 3 h |

*Comparative example
[1)]Addition as dispersion in methoxypropan-2-ol to 100 pbw of coating solution (mean particle diameter in all cases 4 µm)
[2)]MPV = mean pore volume, determined by $H_2O$ adsorption The negative-working mixtures stated in Table 2 were then each applied to 300 µm thick aluminum foil by spin-coating, the foil having been roughened in dilute nitric acid ($R_z$ value according to DIN 4768: 6.0 µm), subjected to intermediate pickling in dilute sulfuric acid, anodized (oxide weight 2.0 g/m²) and hydrophilized with polyvinylphosphonic acid. After drying, the negative-working layer had a weight of 1.0 g/m².

The recording materials produced in this manner were then exposed imagewise to UV light under a photographic negative in a vacuum contact printing frame (irradiance about 400 mJ/cm²). They were then developed with a commercial aqueous alkaline developer for negative printing plates (Agfa EN 232). Table 3 below shows the characteristics of the individual plates:

TABLE 3

| | Examples | | | | |
|---|---|---|---|---|---|
| | 1 | 2 | 3 | 4 | 5* |
| Difference in the optical density (measured by reflection densitometry using a cyan filter relative to bared substrate) | 1.30 | 1.30 | 1.02 | 1.02 | 0.65 |
| Degree of sludge formation in the developing machine (according to EN232-loading with 30 m² plates/l in each case) | slight 1) | slight 1) | slight 1) | slight 1) | strong 3) |
| Screen uniformity 4) | + | 0 | + | 0 | − |
| Evacuation time 5) | 20 s | 32 s | 22 s | 29 s | 50 s |

1) Cleaning possible by simply rinsing off with water (without mechanical assistance)
2) Cleaning possible with water with mechanical assistance (brush, cloth)
3) from 25 m²/l incomplete development
4) Visual screen uniformity: uniformity of the reproduction of a large-area 60-line screen with 20% coverage:
+ = no fragmentation
0 = slight screen nonuniformity, individual fragments
− = pronounced screen nonuniformity, many fragments
5) Evacuation for contact between photographic negative and offset printing plate The process and compositions described above are but one of many methods and compositions that could be used within the scope of the present invention. Accordingly, the above description is only illustrative of preferred embodiments which can achieve the features and advantages of the present invention. It is not intended that the invention be limited to the embodiments described in detail herein. The invention is only limited by the scope of the following claims.

German Patent Application No. 199 15 717.0 filed on Apr. 8, 1999 including the specification, figures, and abstract is expressly incorporated by reference in its entirety.

We claim:

1. A recording material comprising:
   a substrate;
   a negative-working radiation sensitive layer which includes a diazonium salt, at least one metal-free organic colored pigment and a polymeric binder,
   wherein the metal-free organic colored pigments are dispersed in an organic polymeric binder, and
   wherein said layer includes transparent spacer pigments having a pore volume greater than 1 ml/g.

2. The recording material as set forth in claim 1, wherein the transparent spacer pigments have a pore volume greater than 1.5 ml/g.

3. The recording material as set forth in claim 1, wherein the organic, polymeric binder includes hydroxyl groups, at least some of which have been reacted with an intramolecular di- or polycarboxylic anhydride so that the binder has an acid number of from about 20 to about 200.

4. The recording material as set forth in claim 1, wherein the radiation-sensitive layer additionally includes a combination of a polymerizable monomer and a photopolymerization initiator.

5. The recording material as set forth in claim 1, wherein the radiation-sensitive layer additionally includes a combination of a polymerizable oligomer and a photopolymerization initiator.

6. The recording material as set forth in claim 3, wherein the polymeric binder containing hydroxyl groups comprises a polymer having vinyl alcohol units.

7. The recording material as set forth in claim 6, wherein the polymer having vinyl alcohol units comprises a polyvinyl alcohol.

8. The recording material as set forth in claim 6, wherein the polymer having vinyl alcohol units comprises a polyvinyl acetal having free hydroxyl groups.

9. The recording material as set forth in claim 3, wherein the di- or polycarboxylic anhydride comprises an aliphatic, cycloaliphatic, aromatic or heteroaromatic intramolecular di- or polycarboxylic anhydride.

10. The recording material as set forth in claim 9, wherein the aromatic intramolecular di- or polycarboxylic anhydride is selected from phthalic or trimellitic anhydride.

11. The recording material as set forth in claim 1, wherein the polymeric binder has an acid number of from about 50 to about 150.

12. The recording material as set forth in claim 1, wherein the polymeric binder has an average molecular weight $M_W$ of from about 10,000 to about 300,000.

13. The recording material as set forth in claim 1, wherein the polymeric binder has an average molecular weight $M_w$ of from about 20,000 to about 200,000.

14. The recording material as set forth in claim 3, wherein the reaction of the hydroxyl groups of the polymeric binder with the aromatic di- or polycarboxylic anhydrides is carried out in the presence of an organic or inorganic base.

15. The recording material as set forth in claim 14, wherein said base comprises one of triethylamine or sodium carbonate.

16. The recording material as set forth in claim 1, wherein the colored pigments are milled together with an organic solvent or solvent mixture whose boiling point at atmospheric pressure is at least 180° C.

17. The recording material as set forth in claim 16, wherein said solvent has a boiling point at atmospheric pressure from about 180° C. to about 280° C.

18. The recording material as set forth in claim 1, wherein the transparent pigments include $SiO_2$, $Al_2O_3$ or a mixture thereof.

19. The recording material as set forth in claim 1, wherein the transparent pigments have a mean diameter of from about 1 to about 10 $\mu$m.

20. The recording material as set forth in claim 1, wherein the transparent pigments have a mean diameter of from about 2 to about 6 $\mu$m.

21. The recording material as set forth in claim 1, wherein the substrate comprises a metallic substrate.

22. The recording material as set forth in claim 1, wherein the substrate comprises aluminum.

23. The recording material as set forth in claim 1, wherein the substrate comprises an aluminum alloy.

24. The recording material as set forth in claim 22, wherein the aluminum substrate is mechanically, chemically and/or electrochemically roughened.

25. The recording material as set forth in claim 24, wherein the aluminum substrate is additionally anodically oxidized.

26. The recording material as set forth in claim 25, wherein the aluminum substrate further comprises a hydrophilic coating.

27. The recording material as set forth in claim 23, wherein the aluminum substrate is mechanically, chemically and/or electrochemically roughened.

28. The recording material as set forth in claim 27, wherein the aluminum substrate is additionally anodically oxidized.

29. The recording material as set forth in claim 28, wherein the aluminum substrate further comprises a hydrophilic coating.

* * * * *